United States Patent [19]

Murayama

[11] Patent Number: 4,859,878
[45] Date of Patent: Aug. 22, 1989

[54] BI-MOS LEVELSHIFT CIRCUIT CAPABLE OF CONTROLLING POWER CONSUMPTION

[75] Inventor: Yoichi Murayama, Tokyo, Japan

[73] Assignee: NEC Corporation, Tokyo, Japan

[21] Appl. No.: 134,280

[22] Filed: Dec. 17, 1987

[30] Foreign Application Priority Data

Dec. 17, 1986 [JP] Japan ................................ 61-302514

[51] Int. Cl.[4] ........................................... H03K 17/56
[52] U.S. Cl. .................................... 307/446; 307/270;
307/450; 307/451; 307/570; 307/23.8
[58] Field of Search ............... 307/446, 450, 451, 454,
307/475, 570, 264, 270; 357/4, 23.8

[56] References Cited

U.S. PATENT DOCUMENTS

| | | | |
|---|---|---|---|
| 4,609,929 | 9/1986 | Jayaraman et al. | 357/23.8 X |
| 4,639,761 | 1/1987 | Singer et al. | 357/23.8 X |
| 4,701,642 | 10/1987 | Pricer | 307/454 X |
| 4,730,132 | 3/1988 | Watanabe et al. | 307/446 |
| 4,760,293 | 7/1988 | Hebenstreit | 307/446 X |

OTHER PUBLICATIONS

Chang et al., "High-Voltage FET Integrated Circuit Process", IBM T. D. B., vol. 16, No. 5, Oct. 1973, pp. 1635-6.

Primary Examiner—David Hudspeth
Attorney, Agent, or Firm—Helfgott & Karas

[57] ABSTRACT

Disclosed is a levelshift circuit comprising a P-channel MOS transistor wherein the source is connected to a high power potential in a low-voltage power circuit, a first N-channel double-diffused field effect transistor wherein the source is connected to a ground potential and the gate and drain are shorted with each other and connected to the drain of the P-channel MOS transistor, a second N-channel double-diffused field effect transistor wherein the structure is the same as that of the first N-channel double-diffused field effect transistor or different only in its gate width at a predetermined ratio from that of the first N-channel double-diffused field effect transistor, the source is connected to the ground potential and the gate is connected to the gate and drain of the second N-channel double-diffused field effect transistor, a PNP transistor wherein the emitter is connected to the high power potential in the high-voltage power circuit, the base is connected to the drain of the second N-channel double-diffused transistor and the collector is connected to a load, and a switch whereby the gate and drain of the first N-channel double-diffused field effect transistor is short-circuited or opened with respect to the ground potential.

11 Claims, 2 Drawing Sheets

BI-MOS LEVELSHIFT CIRCUIT CAPABLE OF CONTROLLING POWER CONSUMPTION

BACKGROUND OF THE INVENTION

1. Field of the Invention

The present invention relates to a Bi-MOS circuit which is driven by an MOS circuit and more particularly, to a Bi-MOS levelshift circuit with a high-voltage double-diffused metal oxide semiconductor field effect transistor and a high-voltage bipolar transistor.

2. Description of the Related Art

An integrated circuit for driving an electronic display such as fluorescent display and electroluminescent display includes a data processing section operated at a low power voltage and an output section which drives a display device at a high power voltage. The power voltage in the data processing section is generally 5 V and, in virtue of power saving, a complementary MOS (CMOS) circuit is used therefor. The power voltage in the output section is 40 to 100 V in the case with a fluorescent display and 100 to 250 V in the case with an electroluminescent display. A levelshift circuit is used so as to transmit a signal from the data processing section to the output section.

The present inventor has designed and tested a levelshift circuit having a CMOS inverter connected between a low-voltage power source line and the ground, a PNP bipolar transistor having an emitter connected to a high-voltage power source line and a collector connected to a load, and an N-channel double-diffused MOS transistor having a drain connected to the base of this bipolar transistor, a source connected to the ground, and a gate connected to the output of the CMOS inverter. The double-diffused MOS transistor has a high withstand voltage characteristic and is suitable for being used in the high power voltage circuit. According to the inventor's experimental test, the circuit could normally function as a levelshift circuit, but it was difficult to control and reduce the power consumption. This difficulty was caused from such a feature of the double-diffused MOS transistor that its channel length was defined by diffusion process and was difficult to be controlled.

SUMMARY OF THE INVENTION

It is, therefore, a major object of the present invention to provide a Bi-MOS circuit wherein a high-voltage output is obtained with a controlled power consumption.

It is another object of the present invention to provide a Bi-MOS circuit including a low-voltage signal processing section and a high-voltage output section whose power consumption is controlled.

The Bi-MOS circuit in accordance with the present invention comprises a MOS transistor having a source connected to a power line of a low power voltage, a drain and a gate, a first double-diffused field effect transistor having a source connected to a reference potential and a gate and drain short-circuited with each other to be connected to the drain of the MOS transistor, a second double-diffused field effect transistor having a channel width held at a predetermined ratio with respect to that of the first double-diffused field effect transistor and the same remaining structure as the first double-diffused transistor, the second double-diffused transistor having a source connected to the reference potential, a gate connected to the gate and drain of the first double-diffused field effect transistor, a bipolar transistor having an emitter connected to a power voltage line of a high power voltage source, a base connected to the drain of the second double-diffused field effect transistor, and a collector connected to a load, and a means for applying an input signal to the gate and drain of the first double-diffused field effect transistor.

Such a circuit can be utilized effectively as a levelshift circuit for a signal processed with the MOS transistor connected to the low-voltage power line to produce and a high voltage output.

The MOS transistor is favorably of a P-channel type, and the low-voltage power line is supplied with positive power with respect to the reference potential. The first and second double-diffused field effect transistors are favorably of an N-channel type. The bipolar transistor is favorably a PNP transistor.

The power is mainly consumed in this circuit as the drain current in the second double-diffused field effect transistor, which current can be controlled by its gate voltage. The gate voltage in the double-diffused field effect transistor is defined by the drain current of the MOS transistor. Since the MOS transistor has a channel region which can be precisely controlled by a size of gate electrode, the drain current can be easily controlled by forming a predetermined gate length and a predetermined gate width. Thus, the drain current in the second double-diffused field effect transistor can be set at the minimum value for a required operation of the levelshift circuit, which effects to reduce the power consumption.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1:
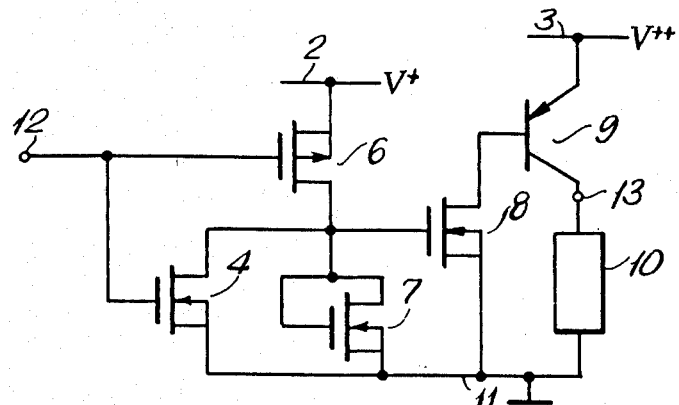
FIG. 1 is a circuit diagram of a levelshift circuit of a first embodiment in accordance with the present invention.

Referring to FIG. 1, a gate 12 of a P-channel MOS transistor 6 receives an output signal of a CMOS logic circuit (not shown) which is operated at a low power voltage (V+). The signal takes a high level of a low power voltage (V+) or a low level of the ground potential.

A high voltage output section with a power line 3 to which a high voltage V++ is applied includes an N-channel double-diffused field effect transistor 8 with which high-voltage tolerance can be easily achieved and a PNP bipolar transistor 9 whose emitter is connected to the high-voltage power lines. The collector of the PNP transistor 9 is connected to output terminal 13.

A load 10 is coupled between the output terminal 13 and a ground line 11.

The source of the P-channel MOS transistor 6 is connected to a power line 2 to which the low voltage V+ is applied. The drain of the P-channel MOS transistor 6 is connected to the gate of the N-channel double-diffused field effect transistor 8 and to the drain and gate of an N-channel double-diffused field effect transistor 7 whose source is connected to the ground line 11.

Since the P-channel MOS transistor 6 is not of a double-diffused structure but of a normal MOS structure, an ON-resistance thereof can be easily designed by virtue of the ratio of a channel length to a channel width. A current mainly determined by the ON-resistance of the P-channel MOS transistor 6 flows into the N-channel double-diffused field effect transistor 7 whose gate and drain are connected in common, generating a gate-drain voltage on the N-channel double-diffused field effect transistor 8. The N-channel double-diffused field effect transistor 8 has the same structure as that of the N-channel double-diffused field effect transistor 7, and the gate voltage applied to the gate 8 of the N-channel double-diffused field effect transistor 8 causes a drain current to flow via the transistor 8 which is identical to the drain current flowing through the transistor 7. Since the drain current of the N-channel double-diffused field effect transistor 7 is determined mainly by the P-channel MOS transistor 6, the drain current can be set at a small value without depending on the manufacturing process of the transistor 7. Hence, the drain current of the N-channel double-diffused field effect transistor 8 can also be set at the same small value as that of the N-channel double-diffused field effect transistor 7. If channel widths are made different between the transistors 7 and 8, the drain current of the transistor 8 becomes at a value which is determined by the ratio of the channel widths between the N-channel double-diffused field effect transistor 7 and the N-channel double-diffused field effect transistor 8.

Each drain current of the N-channel double-diffused field effect transistors 7 and 8 is determined mainly by the ratio of the channel width to the channel length of the P-channel MOS transistor 6, which ratio can be set with excellent accuracy because the transistor 6 is a normal MOS field effect transistor (not double-diffused one). Thus, the drain current of the N-channel double-diffused transistor 8 can be set in with a great accuracy.

A normal N-channel MOS transistor 4 is added between the source of the P-channel transistor 6 and the ground line 11. The gate 12 of the N-channel MOS transistor 4 receives such a signal that the transistor 4 is turned off when the P-channel MOS transistor 6 is on and turned on when the P-channel MOS transistor 6 is off. Therefore the N-channel MOS transistor 4 acts as a switch between a common juncture of the gate and drain of the N-channel double-diffused field effect transistor 7 and the ground potential 11, having a function which applies the ground potential to both the gates of the N-channel double-diffused field effect transistors 7 and 8 when the P-channel MOS transistor is off.

When the input signal applied from the CMOS logic circuit to the gate 12 of the P-channel MOS transistor 6 and to the gate of the N-channel MOS transistor 4 is of the low level (ground potential), the P-channel transistor 6 is turned on so that the gate of the N-channel double-diffused field effect transistor 8 is biased at a value determined by the drain current of the P-channel transistor 6 and the N-channel double-diffused field effect transistor 8 is turned on to supply a necessary and sufficient amount of base current to saturate the base of the PNP transistor 9, whereby the potential of the collector 13 of the PNP transistor 9 is increased to the high power voltage V++. When the input signal at 12 is of the high level (voltage V+), the gate of the N-channel double-diffused field effect transistor 8 is driven to the ground voltage 0V and the N-channel double-diffused field effect transistor 8 turns off. Therefore, the PNP transistor 9 turns off and its collector potential becomes 0V. Consequently, a signal (5V or 0V, for example) in a low-voltage logic section is shifted to a signal (high power voltage or 0V) in a high power voltage level.

Figure 2:
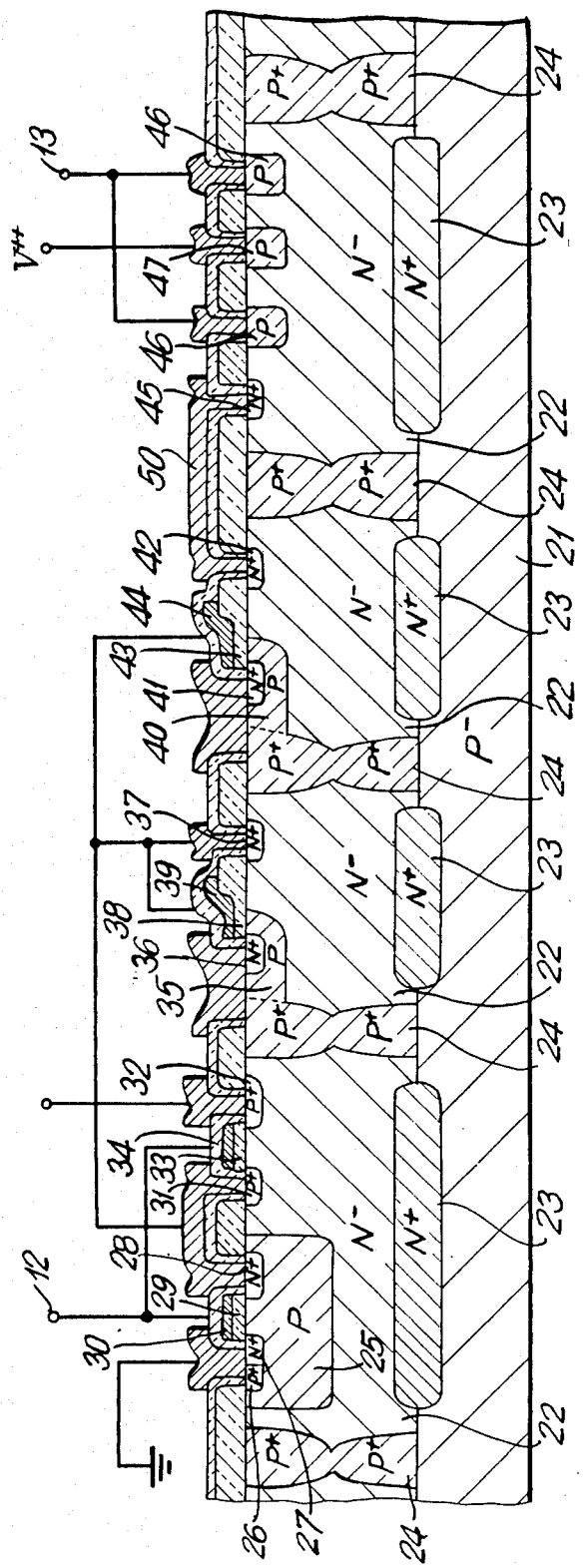
FIG. 2 is a sectional view of a levelshift circuit of the first embodiment in accordance with the present invention.

FIG. 2 is a sectional view illustrating the levelshift circuit of FIG. 1 formed as an integrated circuit on a silicon substrate. An $N^-$ epitaxial layer 22 of 1.5 to 30 ohm-cm in resistivity and 15 to 40 $\mu$m in thickness formed on a $P^-$ silicon substrate 21 of 10 to 50 ohm-cm in resistivity is isolated by $P^+$ regions 24 to a plurality of island regions, and the bottom of each island region is provided with an $N^+$ layer 23 so as to prevent the development of parasitic PNPs and to reduce equivalent resistance in the $N^-$ epitaxial layer 22.

A P well 25 of 7 to 8 $\mu$m in depth formed in the leftmost island region and an $N^+$ drain region 28 and $N^+$ source region 27 are formed in the P well 25 on both sides of a polysilicon gate electrode formed on a gate insulation film 29 of $SiO_2$ to form the N-channel MOS transistor 4. A $P^+$ region 26 is formed so as to establish the same potential between the $N^+$ source region 27 and the P well 25. At the rightside of the P well 25, a $P^+$ drain 31 and a $P^+$ source 32 are formed on both sides of a polysilicon gate electrode 34 formed on a gate insulation film 33 of $SiO_2$ to form the P-channel MOS transistor 6.

In the center two island regions, P regions 35 and 40 in which channel regions will be induced are formed into a depth of 3 to 4 $\mu$m and connected to the silicon substrate 21 by the $P^+$ isolation regions 24. Since the silicon substrate 21 is grounded, these P regions 35 and 40 are also grounded. In the P regions 35 and 40, there are formed $N^+$ regions 36 and 41 into a depth of 1 $\mu$m, respectively. Thus, each channel region is formed at right side of $N^{30}$ regions 36 and 40, respectively, by doubly diffusing the $P^+$ regions 35 and 40 and the $N^+$ regions 36 and 41. On these channel regions, gate insulation films 38 and 43 of $SiO_2$ are formed respectively, and polysilicon gate electrodes 39 and 44 are formed thereon respectively. According to the drain tolerance, there are formed drain regions 37 and 42 at predetermined intervals (10-30 $\mu$m) from the P regions 35 and 40, respectively. Thus, there is formed each of double-diffused field effect transistors 7 and 8.

An $N^+$ base contact region 45 of 1 $\mu$m in depth, a $P^+$ ring shape collector region 46 of 3 to 4 $\mu$m in depth and a $P^+$ emitter region 47 are formed in the rightmost island region to form a lateral PNP transistor.

The surface is passivated with thermally oxidized $SiO_2$ film 48 and CVD-grown $SiO_2$ film 49, and the elements are connected with each other by aluminum wirings 50.

Assuming that the N-channel double-diffused field effect transistor 7 does not exist in the levelshift circuit shown in FIG. 1, the power will be consumed in a large proportion by the drain current of the N-channel double-diffused field effect transistor 8, and the proportion tends to increase especially in accordance with an increase in the high power voltage V++. Therefore, the drain current has to be controlled and set at a value which is necessary and sufficient to the circuit operation, upon designing a high-voltage integrated circuit.

The drain current of a double-diffused field effect transistor 8, however, cannot be made at any value by controlling the ratio of the channel width to the channel length, unlike a normal MOS transistor used in the low-voltage CMOS logic section, since the channel length of the double-diffused field effect transistor 8 is determined by the heat treatment time in a wafer process and the characteristics of this transistor 8 cannot be changed independently without changing the characteristics of double-diffused transistors used for other purposes. Therefore, the drain current of the double-diffused field effect transistor 8 will be controlled by the gate width only. However, this will often render more current flow than required, since there is a limit in the gate width originated in the photolithography technology used in the wafer process. The limit of lithography is of about 5 $\mu$m when manufacturing a double-diffused field effect transistor. When the gate width W is 5 to 10 $\mu$m and the power voltage V++ is 40 to 200 V, a drain current of 0.5 to 1 mA flows in the double-diffused field effect transistor 8, and the power will be consumed by 20 to 200 mW per levelshift circuit.

In accordance with the present invention, the power consumption in the levelshift circuit can be accurately controlled and set at a necessary and sufficient value, since the drain current of the N-channel double-diffused field effect transistor 8 can be controlled accurately by controlling the channel length L and the channel width W of the P-channel transistor 6 and reduced to a smaller value than that determined by the minimum value of the gate width which is limited by the minimum value in the photolithography for this transistor. When the power voltage V+ in a low-voltage side is 5 V and the power voltage V++ in a high-voltage side is 100 V, for example, a current flowing into the n-channel double-diffused field effect transistor 8 can be made 10 $\mu$A by making the channel length L 25 $\mu$m and the channel width W 2.5 $\mu$m for the P-channel MOS transistor 6. Thus, the power consumption per levelshift circuit is made so small as 1 mW.

Figure 3:
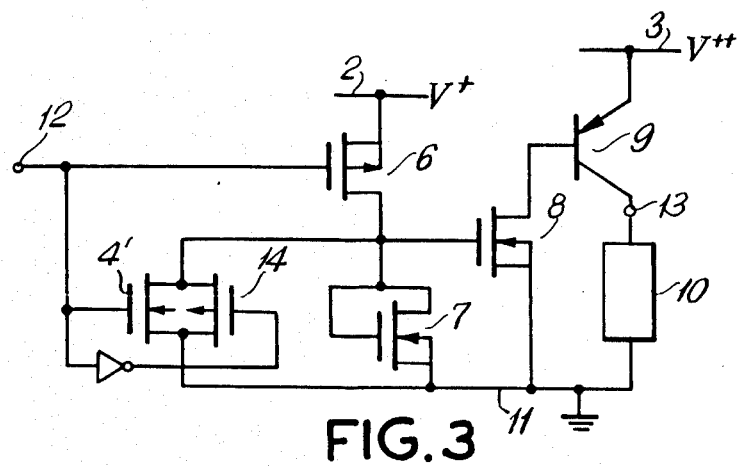
FIG. 3 is a circuit diagram of a levelshift circuit of a second embodiment in accordance with the present invention.

FIG. 3 shows a circuit diagram of second embodiment in accordance with the present invention, which is basically the same as the circuit shown in FIG. 1, but the N-channel MOS transistor 4 is replaced by a transfer gate consisting of an N-channel MOS transistor 4' and a P-channel MOS transistor 14. The same effect can be fully obtained in this embodiment as in the first embodiment.

A low voltage CMOS circuit in a data processing section can be arbitrarily designed according to the required logics. Instead of a PNP transistor, an NPN transistor can also be used; in such a case, a P-channel double-diffused field effect transistor is to be used in place of the N-channel double-diffused field effect transistor 8.

Figure 4:
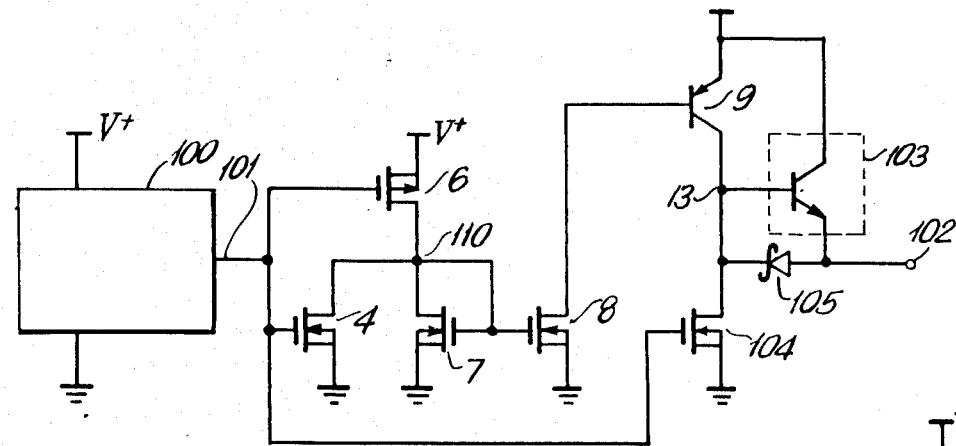
FIG. 4 is a circuit diagram of a Bi-MOS circuit according to a third embodiment of the invention.
Figure 5:
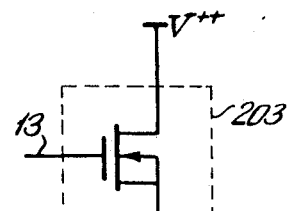
FIG. 5 is another example of a keep-up device to be used in the third embodiment shown in FIG. 4.

Referring to FIG. 4, a low-voltage CMOS logic circuit 100 includes a shift register, inverters and other logic gates (not shown) and operates by a low-voltage power supply (V+). Its output is applied to the input node 101 of a CMOS inverter consisting of a P-channel MOS transistor 6 and an N-channel MOS transistor 4 which are connected in series between the low-voltage power supply (V+) and the ground. This inverter has its output node 110 at the junction of the two transistors 6 and 4 which are larger in size than the inverter transistors in the logic circuit 100 to have larger current-drive capacities. In particular, the current-drive capacity of the P-channel transistor 6 is determined as described in the foregoing. Two N-channel double-diffused MOS transistors 7 and 8 and a PNP bipolar transistor 9 are connected in the same manner as shown in FIG. 1 and another N-channel double-diffused transistor 104 is connected between the collector (output node 13) of the PNP transistor 9 and the ground. The gate of the transistor 104 is connected to the input node 101. A keep-up device 103 (an NPN bipolar transistor in FIG. 4 or an N-channel normal MOS transistor 203 as shown in FIG. 5) is connected between the High-voltage power supply (V++) and the output terminal 102 of the entire circuit to which an electrode of a fluorescent display device is to be connected. The control electrode (base or gate) of the keep-up device 103 is connected to the output node 13 and besides, a Zener diode 105 is connected between the output terminal 102 and the output node 13 for protection. When the signal at the input node 101 is in the high level, the transistor 8 is OFF to turn the PNP transistor 9 OFF, while the transistor 104 is ON to discharge the output node 13 and to bring the output terminal 102 into a ground level. When the input signal at the input node 101 is in the low level, the MOS transistor 104 is turned OFF and the PNP transistor 9 becomes ON to turn the keep-up device 103 ON and supply the V++ potential to the output terminal therethrough.

What is claimed is:

1. A Bi-MOS circuit comprising:
   a MOS field effect transistor having a source connected to a first power potential in a low-voltage power source, a drain and a gate connected to an input terminal;
   a first double-diffused field effect transistor having a source connected to a reference potential and a gate and a drain connected in common with said drain of said MOS field effect transistor;
   a second double-diffused field effect transistor having a source connected to said reference potential, a drain and a gate connected to said gate and said drain of said first double-diffused field effect transistor;
   a bipolar transistor having an emitter connected to a second power potential in a high-voltage power source, a base connected to said drain of said second double-diffused field effect transistor and a collector connected to an output terminal; and
   a means for controlling a potential level, operatively connected to a junction of said gate of said first double-diffused field effect transistor and said gate of said second double-diffused field effect transistor.

2. The Bi-MOS circuit as claimed in claim 1, wherein structures of said first and second double-diffused field effect transistors are the same except that their channel widths are designed to have a predetermined ratio for controlling a base current of said bipolar transistor.

3. The Bi-MOS circuit as claimed in claim 2, wherein said MOS transistor is a P-channel MOS transistor, said first power potential is a positive potential of said low-voltage power source, both said first and second double-diffused field effect transistors are of a N-channel type, said reference potential is a ground potential, said bipolar transistor is a PNP bipolar transistor and said second power potential is a positive potential of said high-voltage power source.

4. The Bi-MOS circuit as claimed in claim 3, wherein said controlling means includes an N-channel MOS transistor.

5. The Bi-MOS circuit as claimed in claim 3, wherein said controlling means includes a transfer gate having an N-channel MOS transistor and a P-channel MOS transistor which are connected in parallel.

6. The Bi-MOS circuit as claimed in claim 3, wherein said bipolar transistor is a lateral PNP transistor.

7. A semiconductor device comprising:
an inverter receiving an input signal and supplied with a low-voltage power;
a first double-diffused field effect transistor having a source connected to a reference potential and a gate and a drain connected in common to an output of said inverter;
a second double-diffused field effect transistor, having a source connected to said reference potential and a gate connected to said drain of said first double-diffused field effect transistor; and
a bipolar transistor having an emitter connected to a high-voltage power source, a base connected to a drain of said second double-diffused field effect transistor and a collector connected to an output terminal.

8. The semiconductor device as claimed in claim 7, wherein channel widths of said first and second double-diffused field effect transistors are designed to control a base current of said bipolar transistor to have a predetermined value and wherein lengths of channels of said first and second double-diffused field effect transistors are the same.

9. The semiconductor device as claimed in claim 8, wherein both said first and second double-diffused field effect transistors are of an N-channel type, and said bipolar transistor is a PNP transistor.

10. The semiconductor device as claimed in claim 9, wherein said inverter is of a complementary MOS type.

11. The semiconductor device as claimed in claim 9, wherein said PNP transistor is a lateral PNP transistor.

* * * * *